United States Patent
Cheng et al.

(10) Patent No.: US 11,092,551 B2
(45) Date of Patent: Aug. 17, 2021

(54) STAIRCASE SURFACE-ENHANCED RAMAN SCATTERING SUBSTRATE

(71) Applicant: International Business Machines Corporation, Armonk, NY (US)

(72) Inventors: Kangguo Cheng, Schenectady, NY (US); Chanro Park, Clifton Park, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 16/656,070

(22) Filed: Oct. 17, 2019

(65) Prior Publication Data

US 2021/0116383 A1 Apr. 22, 2021

(51) Int. Cl.
*G01N 21/65* (2006.01)
*B82Y 20/00* (2011.01)
*H01L 21/311* (2006.01)

(52) U.S. Cl.
CPC ............ *G01N 21/658* (2013.01); *B82Y 20/00* (2013.01); *H01L 21/31144* (2013.01)

(58) Field of Classification Search
CPC .................................................. G01N 21/658
USPC ........................................................ 356/301
See application file for complete search history.

(56) References Cited

U.S. PATENT DOCUMENTS

| 5,849,611 | A | 12/1998 | Yamazaki et al. |
| 7,097,973 | B1 | 8/2006 | Zenhausern |
| 8,358,408 | B2 | 1/2013 | Wu et al. |
| 8,502,971 | B2 | 8/2013 | Zhu et al. |
| 8,547,549 | B2 | 10/2013 | Kuo et al. |
| 8,628,727 | B2 | 1/2014 | Van Duyne et al. |
| 9,394,166 | B1* | 7/2016 | Sechrist ................. B82Y 15/00 |
| 9,500,592 | B2 | 11/2016 | Lin et al. |
| 10,734,244 | B2* | 8/2020 | Kim .................. H01L 21/31116 |
| 2008/0134499 | A1* | 6/2008 | Shioga ................ H01L 21/4857 29/830 |
| 2010/0112496 | A1* | 5/2010 | Nakajima ......... H01L 21/02274 430/325 |

(Continued)

FOREIGN PATENT DOCUMENTS

| CN | 108893715 A | 11/2018 |
| EP | 3040710 A1 | 7/2016 |
| EP | 3040711 A1 | 7/2016 |

OTHER PUBLICATIONS

B. Sharma et al., "SERS: Materials, Applications, and the Future," Materials Today, Jan.-Feb. 2012, pp. 16-25, vol. 15, Nos. 1-2.

*Primary Examiner* — Tarifur R Chowdhury
*Assistant Examiner* — Omar H Nixon
(74) *Attorney, Agent, or Firm* — Randall Bluestone; Ryan, Mason & Lewis, LLP

(57) ABSTRACT

A method for fabricating a surface enhancement of Raman scattering substrate is disclosed. The method further includes patterning a hardmask on a portion of a substrate. The method further includes directionally etching a portion of an exposed portion of the substrate to form a first stepped portion. The method further includes trimming the hardmask laterally to a first predetermined width. The method further includes directionally etching a portion of exposed horizontal portions of the substrate to form a second stepped portion.

20 Claims, 19 Drawing Sheets

(56) References Cited

U.S. PATENT DOCUMENTS

2012/0170032 A1 7/2012 Zhu et al.
2016/0220996 A1* 8/2016 Bai .................... B81C 1/00103

* cited by examiner

STAIRCASE SURFACE-ENHANCED RAMAN SCATTERING SUBSTRATE

BACKGROUND

Surface-Enhanced Raman Scattering (SERS) can be used for a variety of applications such as, for example, label-free sensing, drug delivery/targeting, etc. SERS is a technique using Raman scattering for enhancing the detection of molecular species through the excitation of Plasmon modes and their coupling to molecular vibrational modes. In other words, Raman scattering is the inelastic scattering of photons that can provide vibrational fingerprints of molecules. The substrate surface on which the detection of molecular species is taking place, as well as the material of the substrate surface, affects the strength and intensity of the Raman scattering.

SUMMARY

According to an exemplary embodiment of the present invention, a method for fabricating a Surface-Enhanced Raman Scattering substrate comprises patterning a hardmask on a portion of a substrate. The method further comprises directionally etching a portion of an exposed portion of the substrate to form a first stepped portion. The method further comprises trimming the hardmask laterally to a first predetermined width. The method further comprises directionally etching a portion of exposed horizontal portions of the substrate to form a second stepped portion.

According to an exemplary embodiment of the present invention, a method for fabricating a Surface-Enhanced Raman Scattering substrate comprises forming alternating layers of an insulating layer and a metal layer on a substrate. The insulating layer is deposited on a top surface of the substrate. A top layer of the alternating layers is a top metal layer. The method further comprises patterning a hardmask on a portion of the alternating layers. The method further comprises directionally etching an exposed portion of the top metal layer exposing the alternating insulating layer. The method further comprises directionally etching the exposed portion of the alternating insulating layer to form a first stepped portion. The method further comprises trimming the hardmask laterally to a first predetermined width. The method further comprises directionally etching a portion of exposed horizontal portions of the alternating metal layers substrate. The method further comprises directionally etching exposed horizontal portions of the alternating insulating layer to form a second stepped portion.

According to an exemplary embodiment of the present invention, a structure comprises a substrate. The structure further comprises an array of pillars disposed on the substrate. Each pillar is of a staircase configuration. The structure further comprises a metal layer disposed on each of the pillars on the substrate.

According to an exemplary embodiment of the present invention, a structure comprises a substrate. The structure further comprises an array of pillars disposed on the substrate. Each pillar comprises a staircase configuration. Each pillar further comprises alternating layers of an insulating layer and a metal layer. The insulating layer is disposed on a top surface of the substrate. The top layer of the alternating layers is a top metal layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
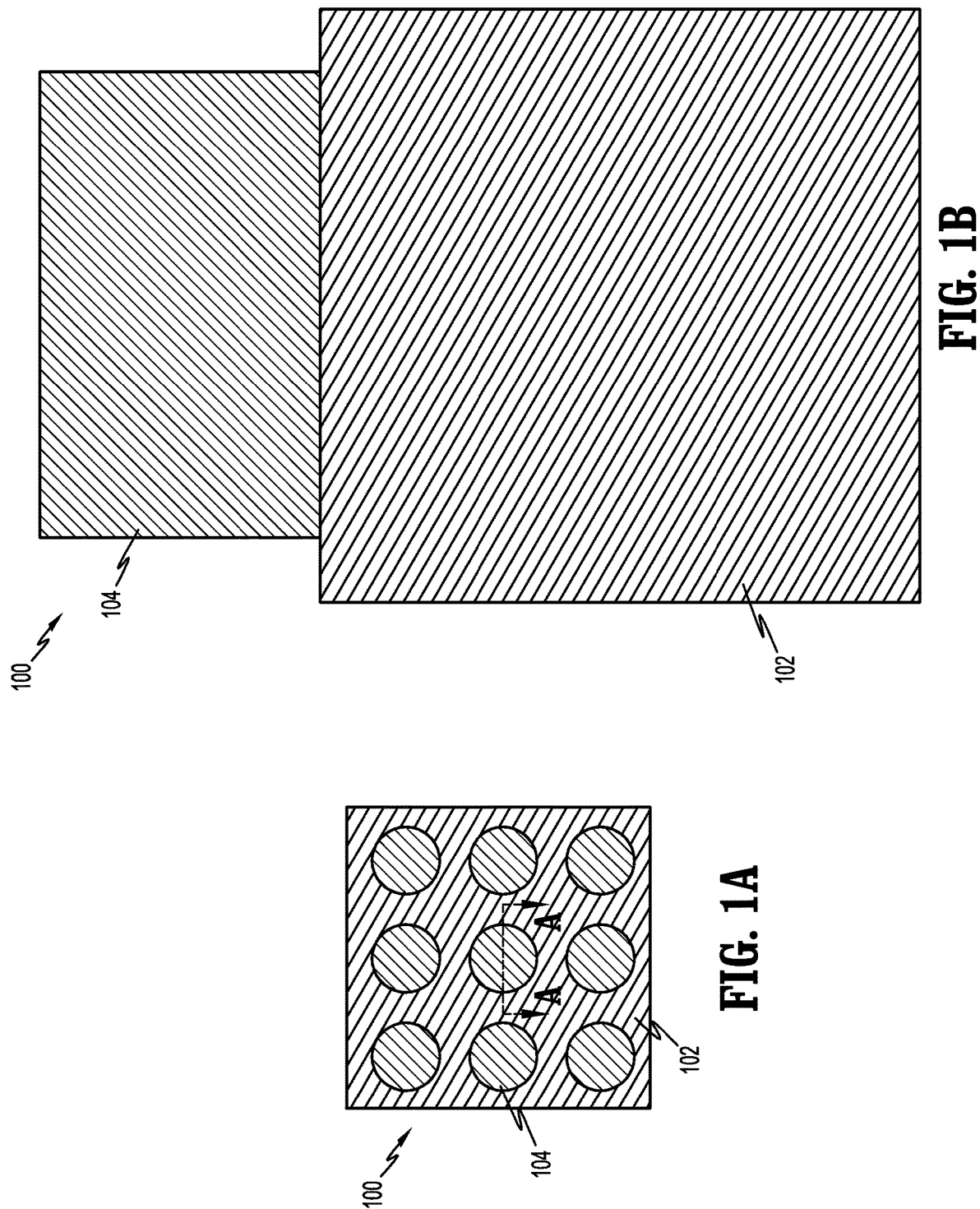
FIG. 1A is a top view of a substrate showing the A-A axis, according to an illustrative embodiment.
FIG. 1B is a cross sectional view of the substrate taken along the A-A axis of FIG. 1A at a first-intermediate fabrication stage, according to an illustrative embodiment.

This disclosure relates generally to Surface-Enhanced Raman Scattering substrates and methods for their fabrication.

Raman signals are inherently weak, especially when using visible light excitation. The scattering efficiency is low, so that only a small number of scattered photons are available for detection. One method to amplify weak Raman signals is to employ nanoscale roughened metal (e.g., gold (Au) or silver (Ag) surfaces), referred to as Surface-Enhanced Raman Spectroscopy (SERS). A highly localized field can be created at these roughened metal nanostructures by the surface under a laser excitation. When a molecule is absorbed or lies close to the enhanced field at the surface, a large enhancement in the Raman signal can be observed compared to conventional Raman spectroscopy, which is useful for important applications such as molecule detection. Even though SERS is a potentially powerful spectroscopy technique that allows for highly sensitive structural detection of low concentration analytes through the amplification of electromagnetic fields generated by the excitation of localized surface plasmons, many challenges emerge when attempting to use these nanostructures. For example, a challenge of SERS is the formation of SERS substrates with dense and uniform SERS arrays.

Accordingly, illustrative embodiments herein provide methods for forming a SERS substrate with a dense and uniform array with the staircase configuration by a cyclic etch and hardmask trimming process. Metals (e.g., silver, gold, copper, etc.) can then be deposited on top of the array to form the resulting SERS substrate.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1A-19 illustrate various processes for fabricating SERS substrates with a staircase configuration. Note that the structure described herein can also be considered to be a semiconductor device and/or an integrated circuit, or some part thereof. For the purpose of clarity, some fabrication steps leading up to the production of the structure as illustrated in FIGS. 1A-19 are omitted. In other words, one or more well-known processing steps which are not illustrated but are well-known to those of ordinary skill in the art have not been included in the figures.

FIGS. 1A-10 illustrate one embodiment of the present invention. Note that the same reference numeral (100) is used to denote the semiconductor structure through the various intermediate fabrication stages illustrated in FIGS. 1A through 10. FIG. 1A illustrates a top view of structure 100 showing the A-A axis across one patterned hard mask 104 on a substrate 102. FIG. 1B is a cross sectional view of the structure taken along the A-A axis of FIG. 1A at a first-intermediate fabrication stage.

As shown in FIGS. 1A and 1B, structure 100 includes substrate 102 with hardmask 104. In one embodiment, the substrate 102 is a semiconductor substrate comprised of, for example, silicon (Si). In another embodiment, the substrate is comprised of a semiconductor material including, but not limited to, silicon, germanium, a silicon-germanium alloy, a silicon carbon alloy, a silicon-germanium-carbon alloy, gallium arsenide, indium arsenide, indium phosphide, group III-V compound semiconductor materials, group II-VI compound semiconductor materials, organic semiconductor materials, or any other compound semiconductor materials. The substrate can be a single crystalline material, a polycrystalline material, or an amorphous material. However, the substrate may be comprised of any material suitable for use in accordance with the embodiments described herein. For example, the substrate can be glass, a ceramic, a plastic, a polymer, etc. The substrate can comprise a single material or multiple materials.

A hardmask layer 104 is then formed on the surface of substrate 102. As shown in FIG. 1A, hardmask 104 is deposited and patterned to form an array for forming a number of three-dimensional nano-structures protruding from the surface as discussed herein below and shown in FIG. 10. Hardmask 104 can be deposited using deposition techniques including, but not limited to, chemical vapor deposition (CVD), plasma enhanced CVD (PECVD), and physical vapor deposition (PVD). Suitable material for hardmask 104 includes, for example, silicon nitride, silicon oxide, amorphous carbon, organic polymer, photoresist, etc. The hardmask 104 can be patterned by any suitable patterning technique including, but not limited to, lithography followed by etching. Other suitable techniques include sidewall image transfer (SIT), self-aligned double patterning (SADP), self-aligned quadruple patterning (SAQP), self-aligned multiple patterning. Non-limiting dimensions of the hardmask 104 include a lateral width (diameter) ranging from about 100 nanometers (nm) to about 10,000 nm and a thickness of about 10 nm to about 100 nm. As shown in FIG. 1A, each hardmask pillar has a circular shape. However, other shapes are contemplated such as, for example, oval, rectangle, square, pentagon, triangle, hexagon, octagon, diamond, and star.

Figure 2:
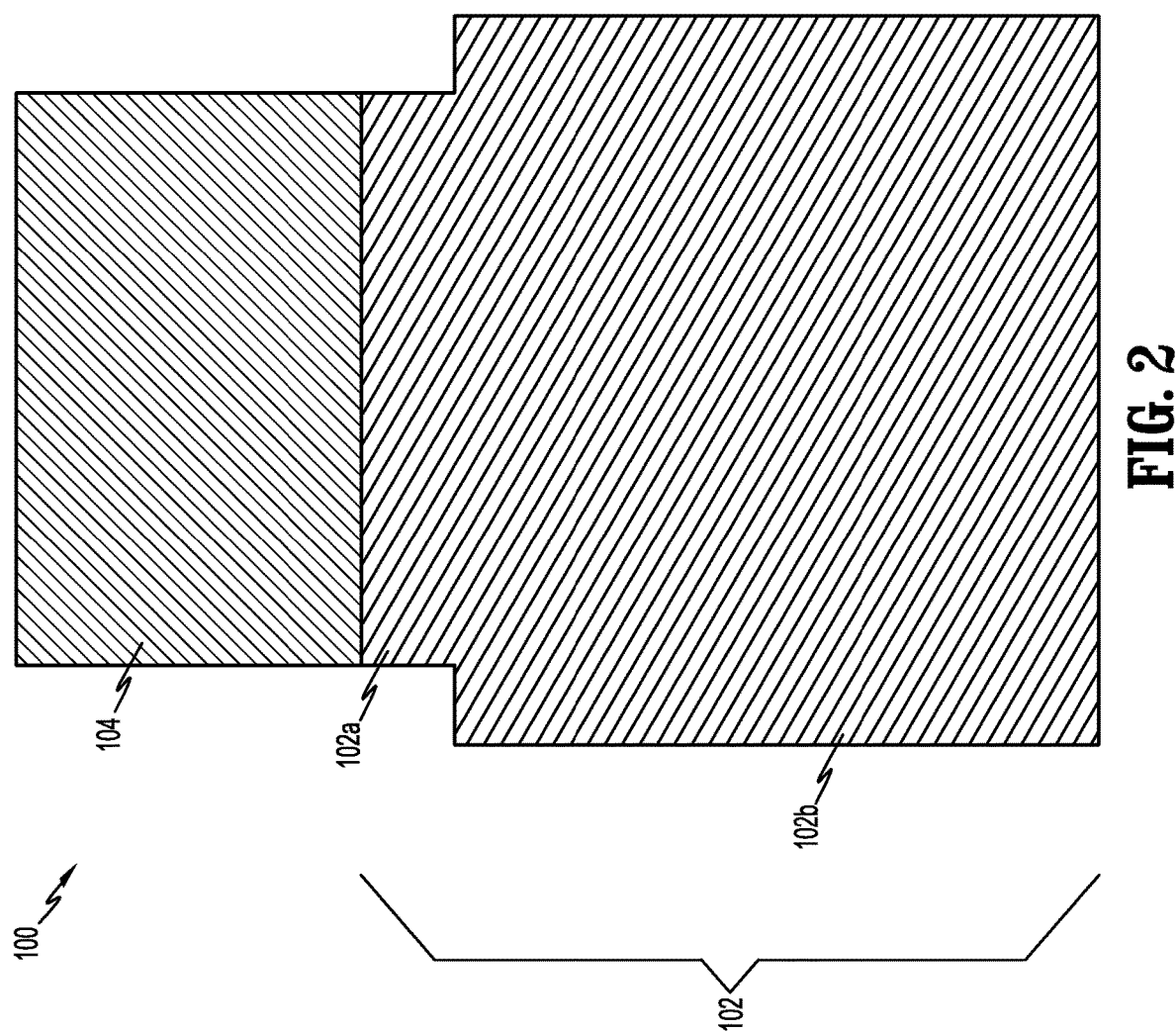
FIG. 2 is a cross sectional view of the substrate taken along the A-A axis of FIG. 1A at a second-intermediate fabrication stage, according to an illustrative embodiment.

FIG. 2 is a cross-sectional view illustrating the structure 100 taken along the A-A axis of FIG. 1A at a second intermediate stage of fabrication according to an exemplary embodiment. During this stage, a directional etching process such as, for example, a reactive-ion-etching (RIE) process or ion beam etching process, is carried out to etch a portion of the exposed top surface of substrate 102. In one embodiment, the directional etching process is a cyclic directional (i.e., vertical) etching process to form a cyclic step or cyclic staircase portion. The cyclic etch may be carried out for about 2 to about 200 cycles until the desired height and diameter are achieved. In one embodiment, the cyclic etch process comprises performing two or more instances of an etch cycle (202) to incrementally etch substrate 102 until a uniform first staircase portion 102a is obtained. The etching results in a first step of a staircase configuration which includes the base staircase portion 102b and a first staircase portion 102a of substrate 102. Non-limiting dimensions in FIG. 2 for step 102a include a lateral width (diameter) range of about 100 nm to about 10,000 nm and a depth of about 10 nm to about 100 nm.

Figure 3:
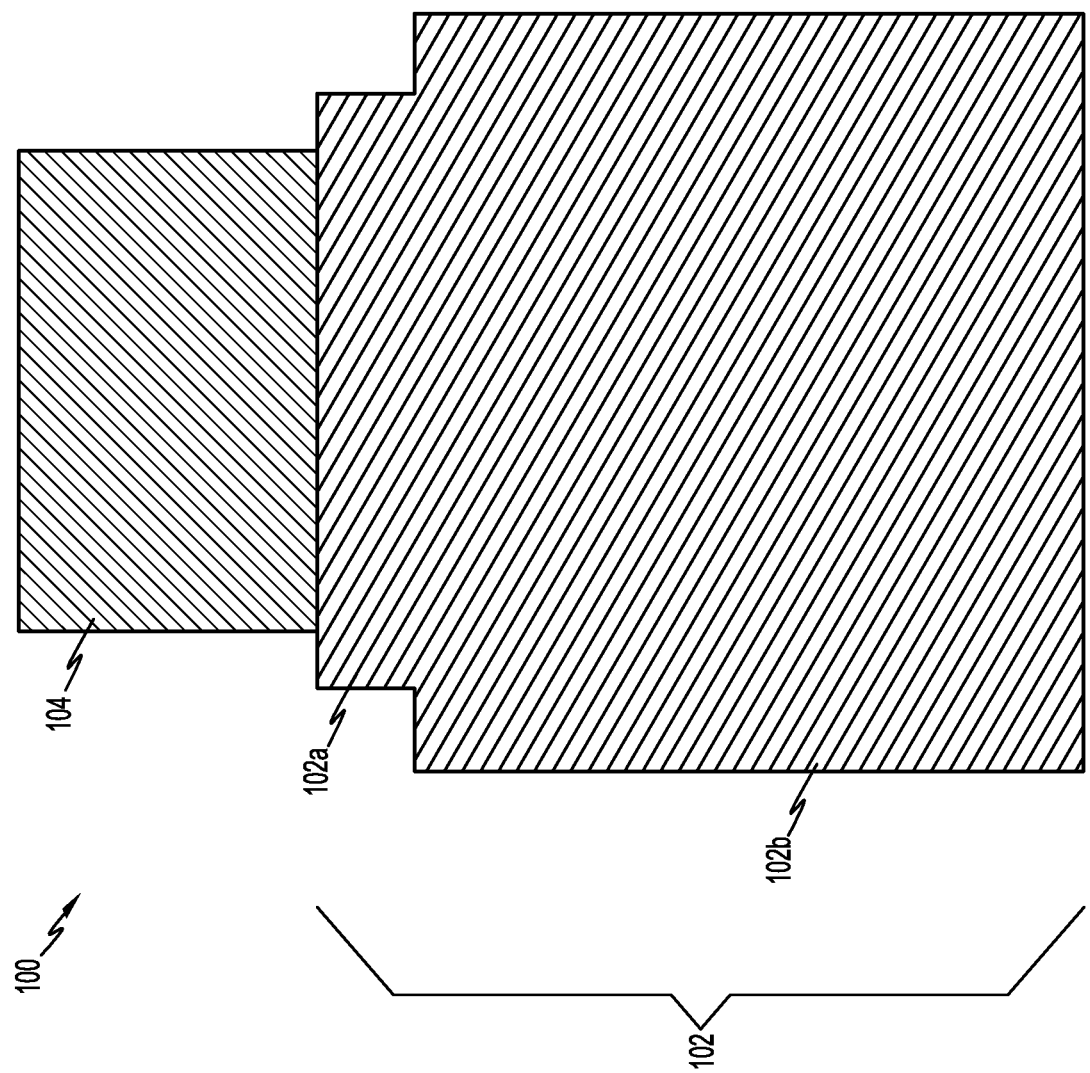
FIG. 3 is a cross sectional view of the substrate taken along the A-A axis of FIG. 1A at a third-intermediate fabrication stage, according to an illustrative embodiment.

FIG. 3 is a cross-sectional view illustrating the structure 100 taken along the A-A axis of FIG. 1A at a third intermediate stage of fabrication according to an exemplary embodiment. During this stage, hardmask 104 is trimmed by laterally etching using a selective etching process such as, for example, an isotropic dry or wet etching process. In general, hardmask 104 is laterally etched to a desired width or diameter for performing another directional etch process to form the next step in the staircase configuration.

Figure 4:
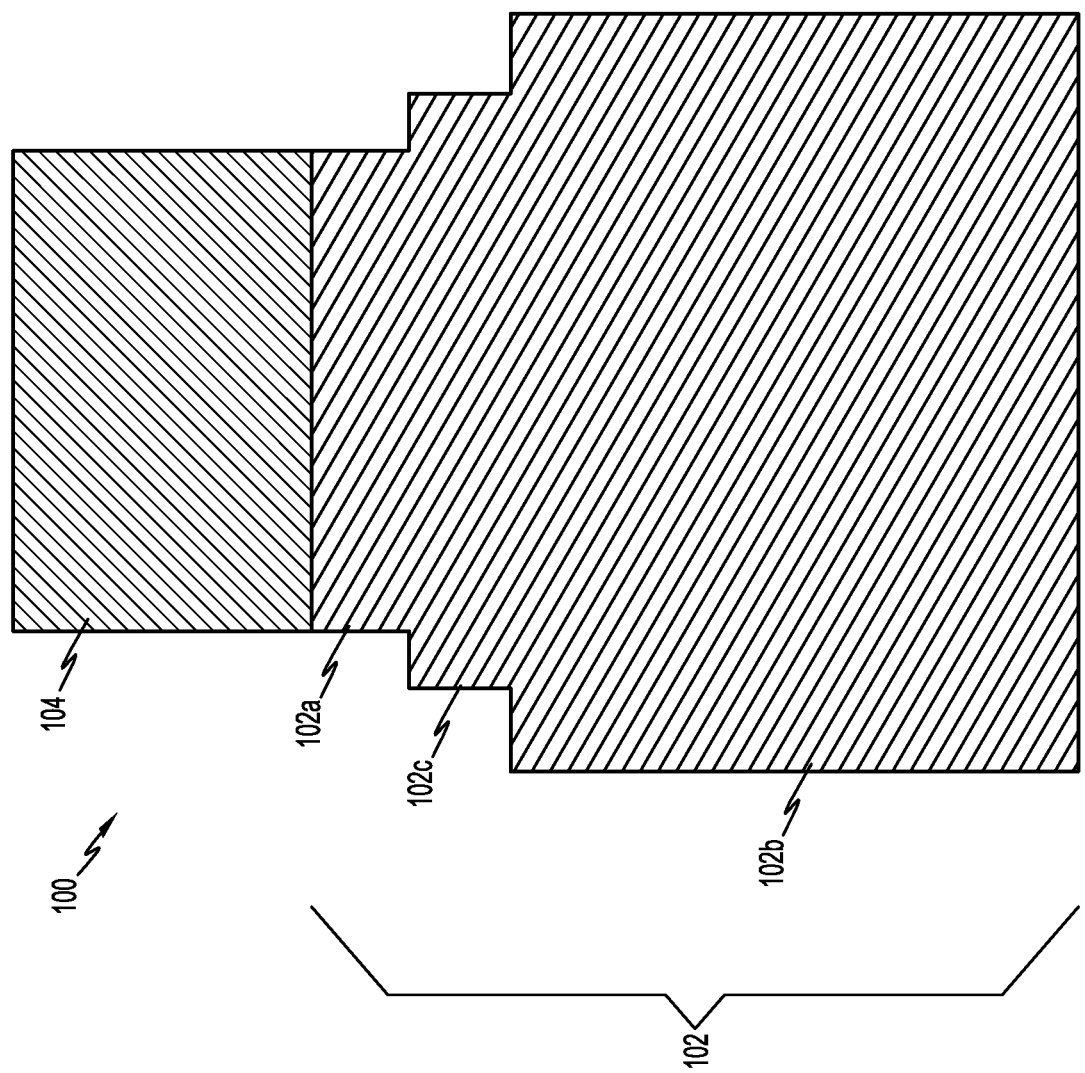
FIG. 4 is a cross sectional view of the substrate taken along the A-A axis of FIG. 1A at a fourth-intermediate fabrication stage, according to an illustrative embodiment.

FIG. 4 is a cross-sectional view illustrating the structure 100 taken along the A-A axis of FIG. 1A at a fourth intermediate stage of fabrication according to an exemplary embodiment. During this stage, another directional etching process such as, for example, RIE process, is carried out to further etch first staircase portion 102a and a portion of base staircase portion 102b of substrate 102 to form a second staircase portion 102c, i.e., step, in the staircase configuration. In one embodiment, second staircase portion 102c has a width or diameter that is greater than the width or diameter of first staircase portion 102a and a width or diameter less than the width or diameter of base staircase portion 102b.

Figure 5:
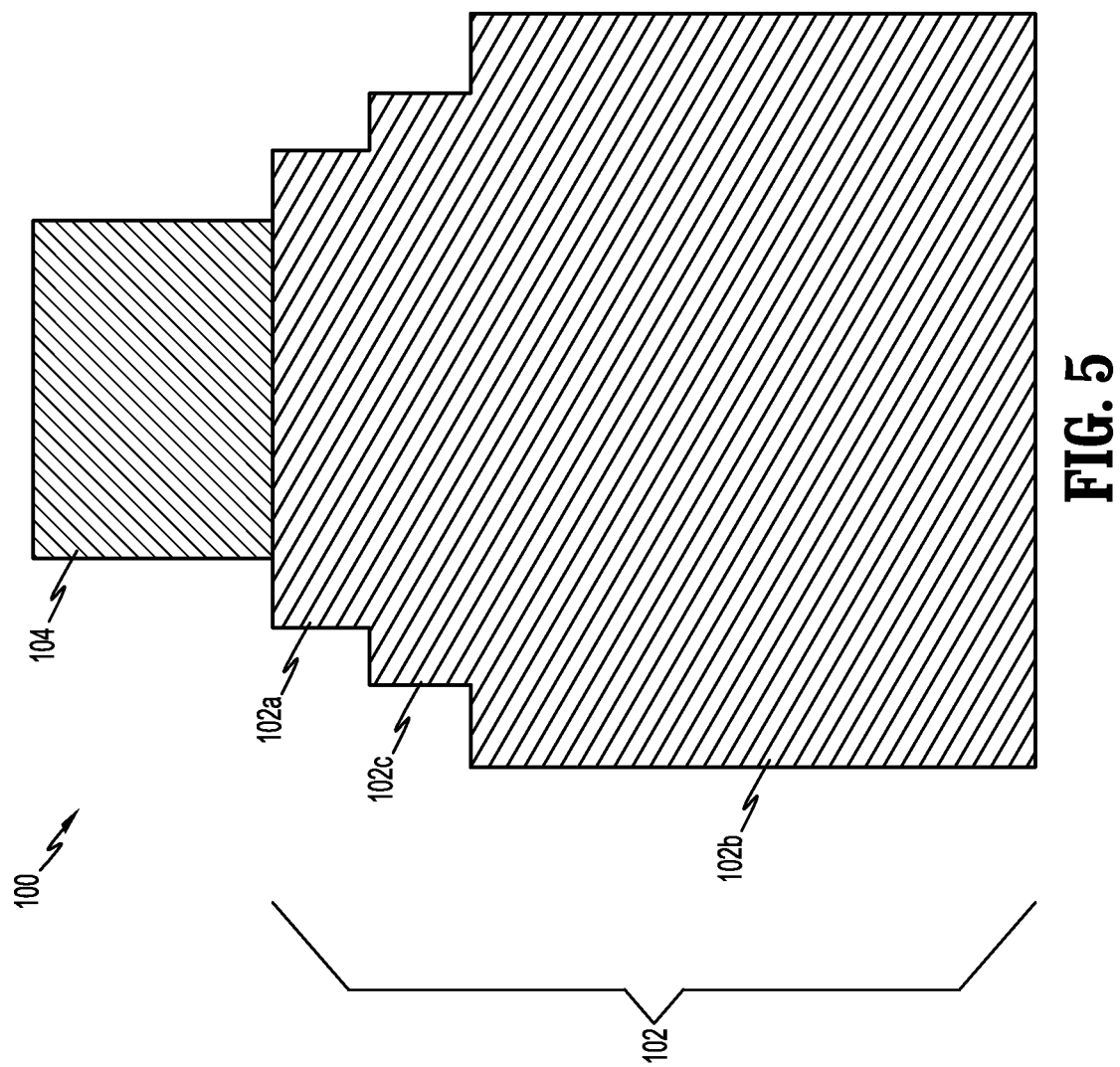
FIG. 5 is a cross sectional view of the substrate taken along the A-A axis of FIG. 1A at a fifth-intermediate fabrication stage, according to an illustrative embodiment.

FIG. 5 is a cross-sectional view illustrating the structure 100 taken along the A-A axis of FIG. 1A at a fifth intermediate stage of fabrication according to an exemplary embodiment. During this stage, hardmask 104 is further trimmed by laterally etching hardmask 104 using a selective etching process as discussed above. In general, hardmask 104 is laterally etched to a desired width or diameter for performing another directional etch process to form the next step in the staircase configuration.

Figure 6:
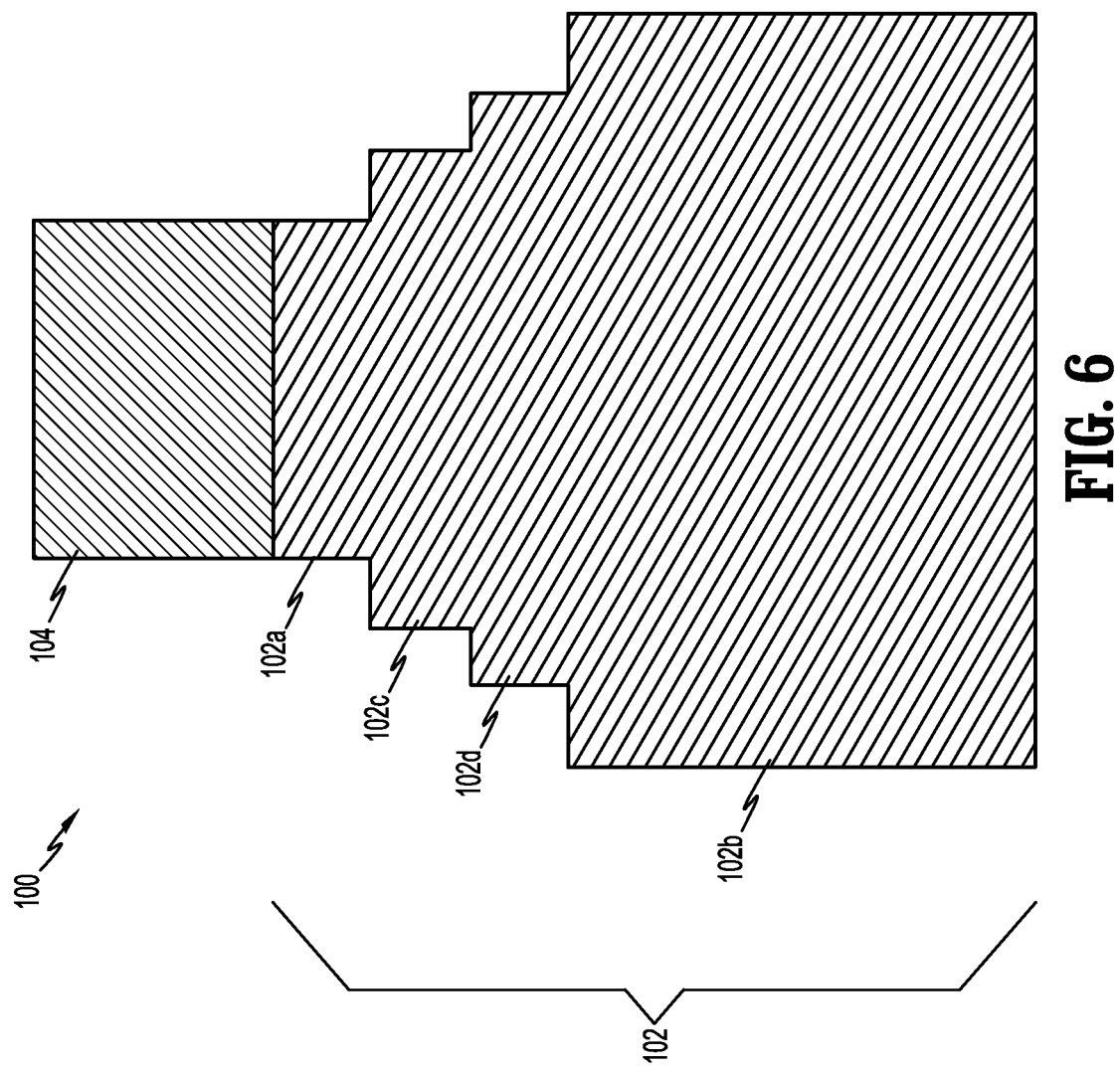
FIG. 6 is a cross sectional view of the substrate taken along the A-A axis of FIG. 1A at a sixth-intermediate fabrication stage, according to an illustrative embodiment.

FIG. 6 is cross-sectional view illustrating the structure 100 taken along the A-A axis of FIG. 1A at a sixth intermediate stage of fabrication according to an exemplary embodiment. During this stage, another directional etching process such as, for example, RIE process, is carried out to further etch first staircase portion 102a, second staircase portion 102c and a portion of base staircase portion 102b of substrate 102 forming a third staircase portion 102d in the staircase configuration. In one embodiment, third staircase portion 102d has a width or diameter that is greater than the width or diameter of second staircase portion 102c and first staircase portion 102a and a width or diameter less than the width or diameter of base staircase portion 102b. In addition, second staircase portion 102c has a width or diameter that is greater than the width or diameter of first staircase portion 102a and a width or diameter less than the width or diameter of base staircase portion 102b.

Figure 7:
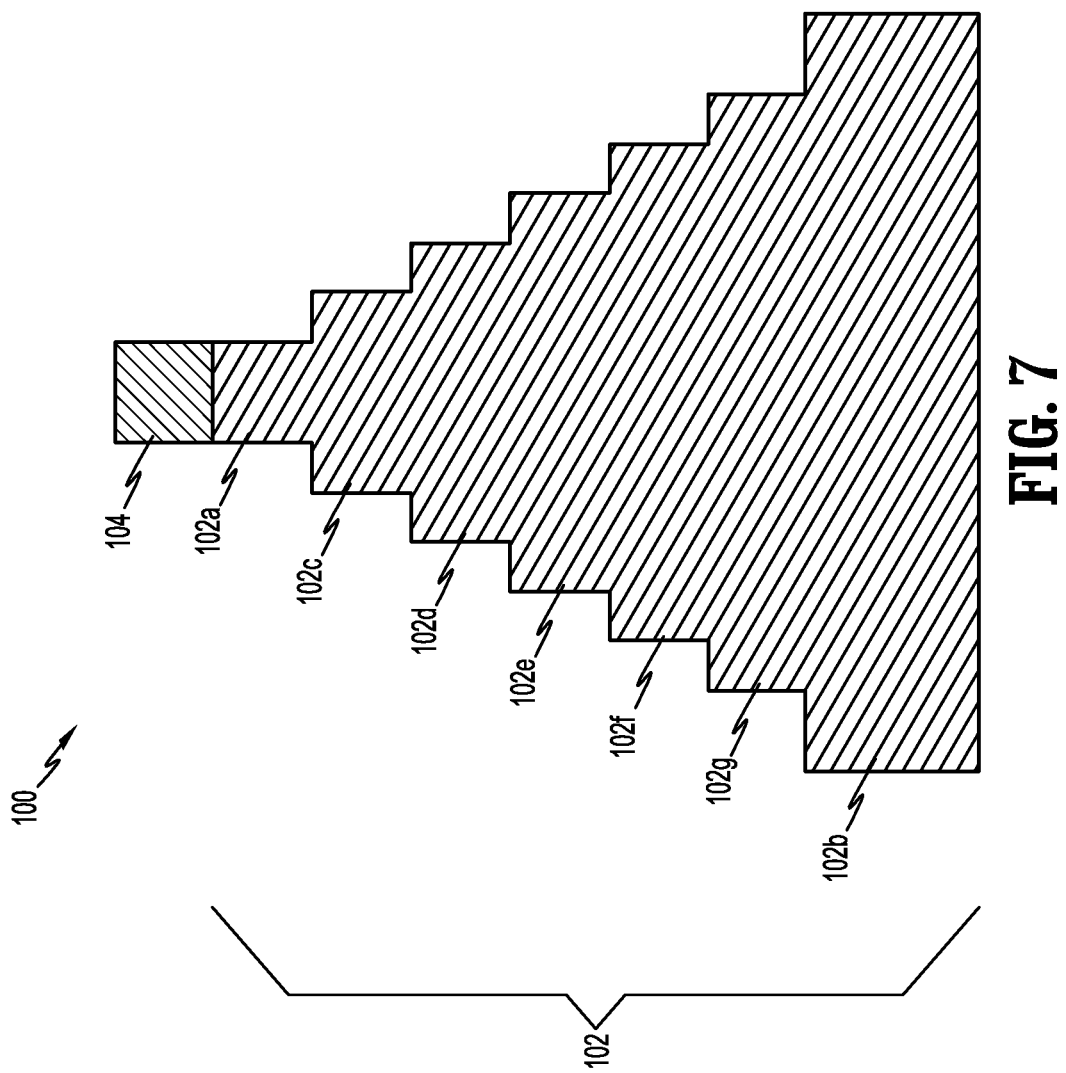
FIG. 7 is a cross sectional view of the substrate taken along the A-A axis of FIG. 1A at seventh-intermediate fabrication stage, according to an alternative illustrative embodiment.

FIG. 7 is cross-sectional view illustrating the structure 100 taken along the A-A axis of FIG. 1A at a seventh intermediate stage of fabrication according to an exemplary embodiment. As one skilled in the art will understand, the process disclosed herein can be continued until the desired number of staircase portions, i.e., steps, are obtained. The number of staircase portions will depend on the number of desired steps and corners. The corners enhance electrical field and thus Raman scattering. In other words, laser excitation of these metal nanostructures resonantly drives the surface charges creating a highly localized (plasmonic) light field. When a molecule is absorbed or lies close to the enhanced field at the surface, a large enhancement in the Raman signal can be observed. SERS is finding increasing use in a variety of applications including, but not limited to, analytical chemistry testing, chemical substance testing, biosensors detection, forensics, detecting of trace amounts of chemical and biological threat agents, and other medical diagnostic devices.

Accordingly, one or more trimming and directional etching steps will be repeated to obtain the desired staircase configuration. As shown in FIG. 7, staircase portions 102d, 102e, 102f and 102g are obtained by carrying out the trimming and directional etching steps discussed above. Non-limiting dimensions include a vertical depth of each stair of about 5 nm to about 100 nm and a lateral width of each stair of about 5 nm to about 100 nm.

Figure 8:
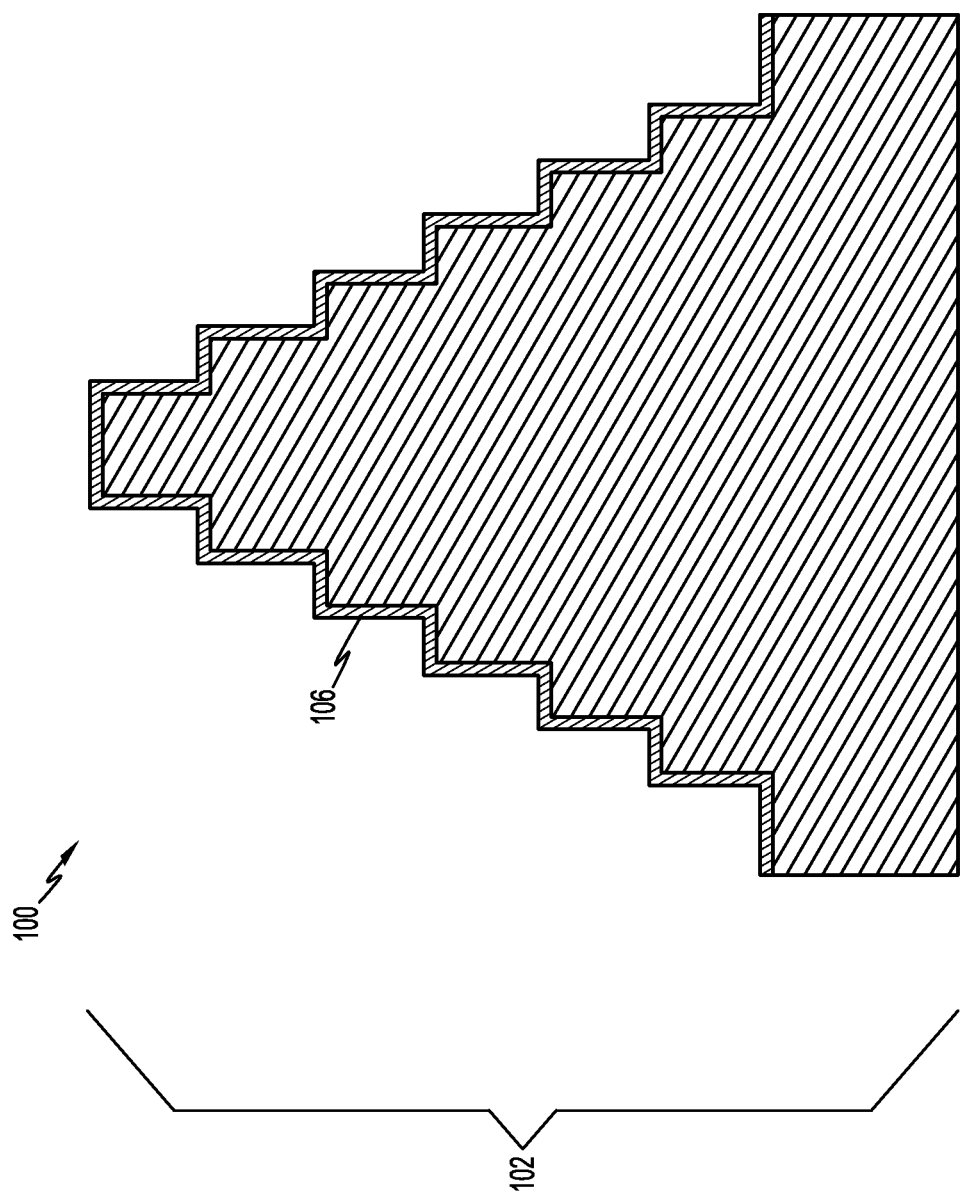
FIG. 8 is a cross-sectional view of the substrate taken along the A-A axis of FIG. 1A at an eighth-intermediate fabrication stage, according to an illustrative embodiment.

FIG. 8 is cross-sectional view illustrating the structure 100 taken along the A-A axis of FIG. 1A at an eighth intermediate stage of fabrication according to an exemplary embodiment. During this stage, optionally, hardmask 104 is removed by conventional techniques. Next, metal layer 106 is deposited on the exterior surface of structure 100 and covers the staircase configuration. Metal layer 106 can be deposited by coating a plasmonic metal film, and may use techniques such as PVD, CVD, atomic layer deposition (ALD), sputtering, etc. In one embodiment, metal layer 106 is a plasmonic metal film. The metal layer 106 may be formed of gold (Au), silver (Ag), platinum (Pt), copper (Cu), aluminum (Al) and the like. In some embodiment, the metal layer comprises a metal alloy such as Ag:Cu. The metal layer 106 may have a uniform thickness in the range of about 1 nm to about 10 nm, although other thicknesses that are greater or less than this range may be employed as desired depending on the particular application.

Alternatively, the metal layer 106 may have a non-uniform thickness, for example, a thicker film in some areas (e.g., corners) and a thinner film in other areas (e.g., vertical sidewalls). In some embodiments, although not shown, metal layers between adjacent stairs can be discontinuous. There are several ways to form discontinuous metal films. For example, in one illustrative embodiment, a method can include, after forming the continuous metal layer shown in FIG. 8, carrying out a directional etch (e.g., ME) to remove the metal layer on horizontal surfaces, leaving metal layers only on vertical sidewalls. In another illustrative embodiment, a method can include using a non-conformal deposition such as PVD or sputtering, resulting in the metal layer being concentrated at the convex corners and the top of the substrate.

Figure 9:
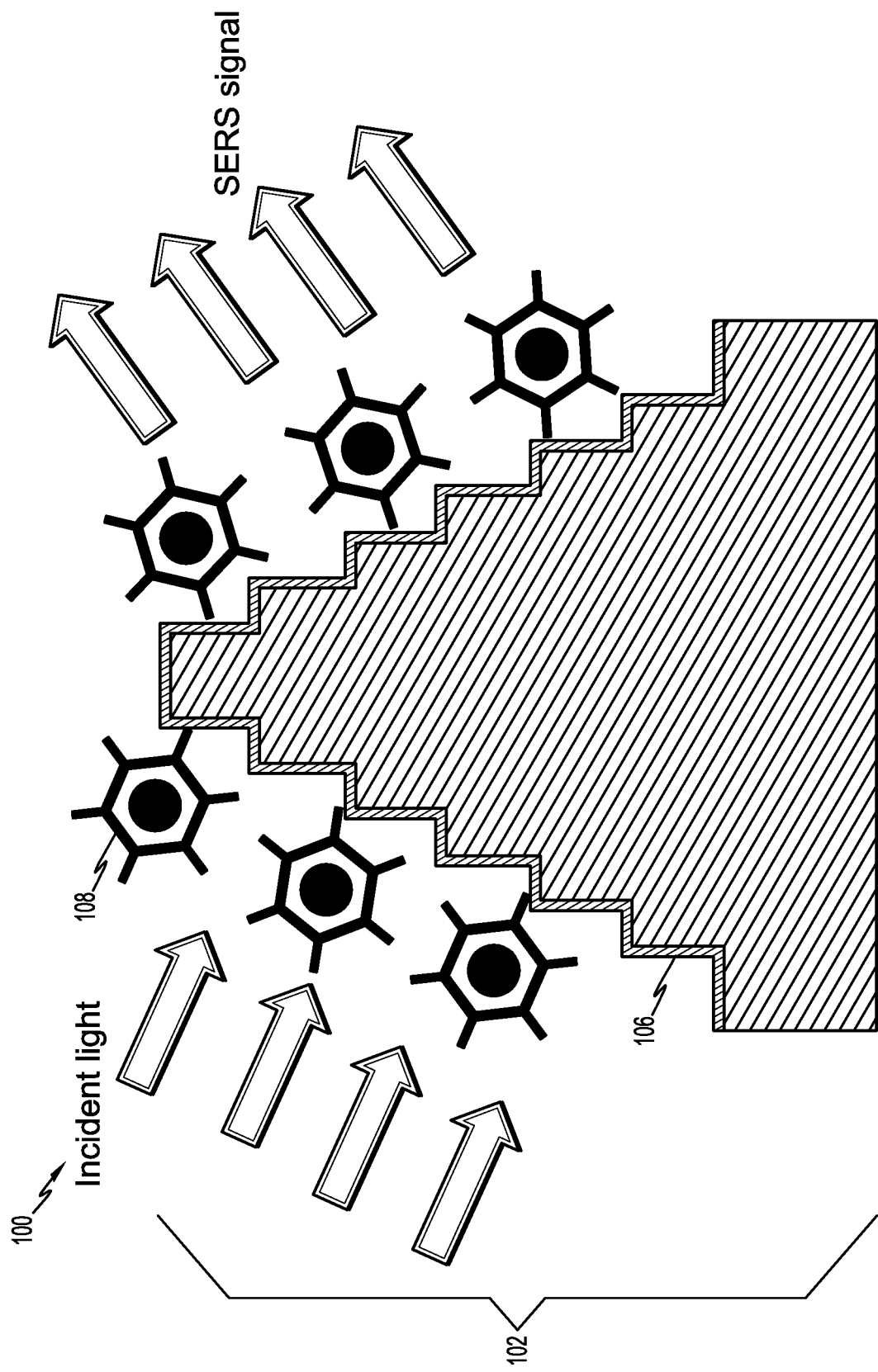
FIG. 9 is a cross-sectional view of the substrate taken along the A-A axis of FIG. 1A at a ninth-intermediate fabrication stage, according to an illustrative embodiment.

FIG. 9 is cross-sectional view illustrating the structure 100 taken along the A-A axis of FIG. 1A at a ninth intermediate stage of fabrication according to an exemplary embodiment. During this stage, molecules 108 are attached to the metal layer 106 using, for example, laser excitation at a desired frequency selected for the plasmonic metal resonantly drives the surface charges creating a highly localized (plasmonic) light field. When a molecule is absorbed or lies close to the enhanced field at the surface, a large enhancement in the output SERS signal can be observed due to the dense grouping of the corners of the staircase substrate, i.e., several orders of magnitude greater than normal Raman scattering. The collected SERS signals are analyzed to identify a change in frequency which provides an indication of the type of molecule or analyte on the SERS structure.

Figure 10:
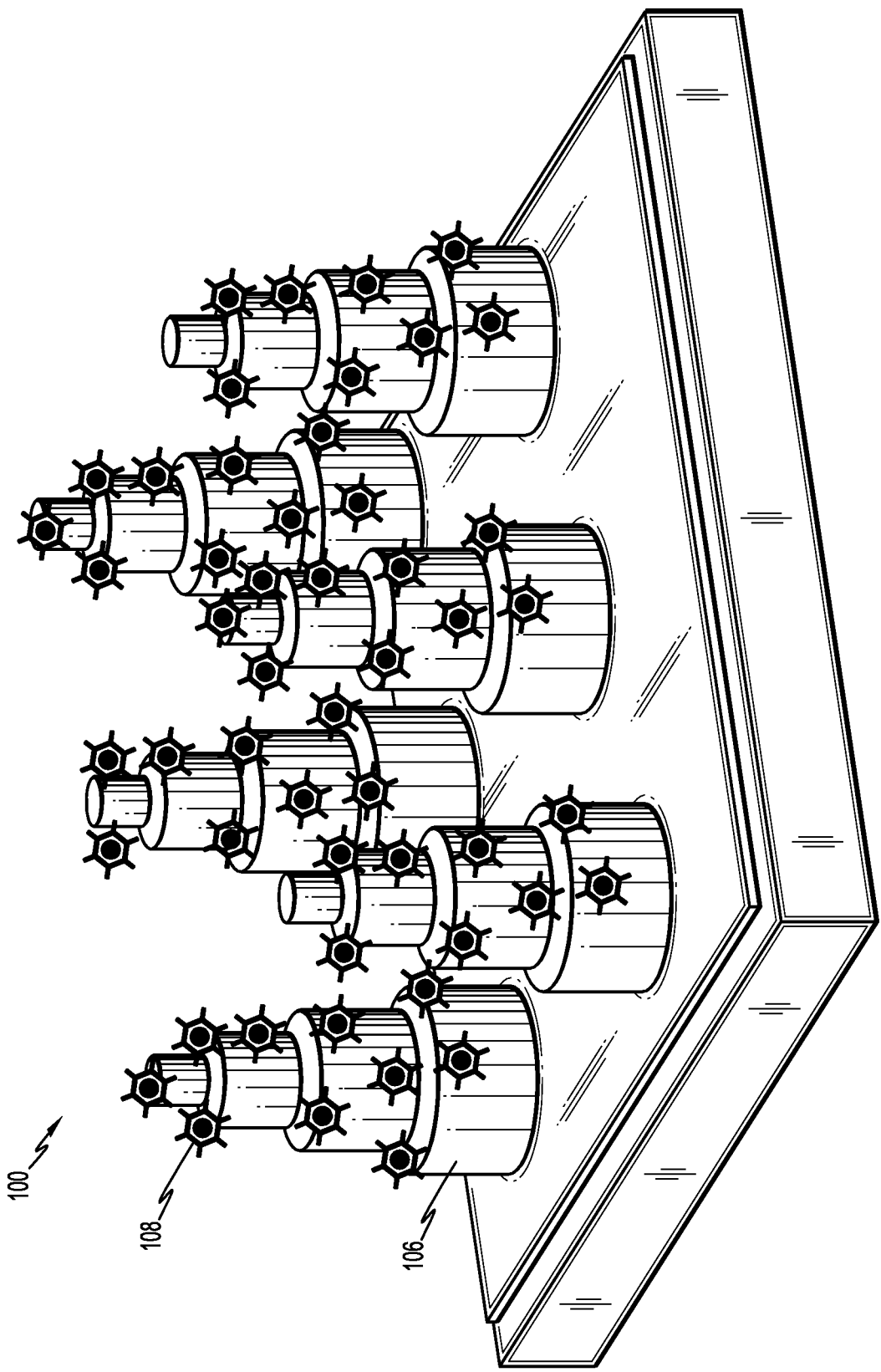
FIG. 10 is a perspective view of the resulting substrate, according to an illustrative alternative embodiment.

Next, an application for SERS using the substrate is carried out for detecting molecules 108. As shown in FIG. 9, incident light is directed towards the surface of the structure 100, and a resulting SERS signal is reflected. The resulting SERS signal may be used to detect the type of molecules 108 present. In some embodiments, the structure 100 may be part of an integrated circuit chip or other device in which one or more CMOS devices are also formed for detecting the resulting SERS signal. FIG. 10 is a perspective view of the resulting structure 100 including the SERS substrate.

Figure 11:
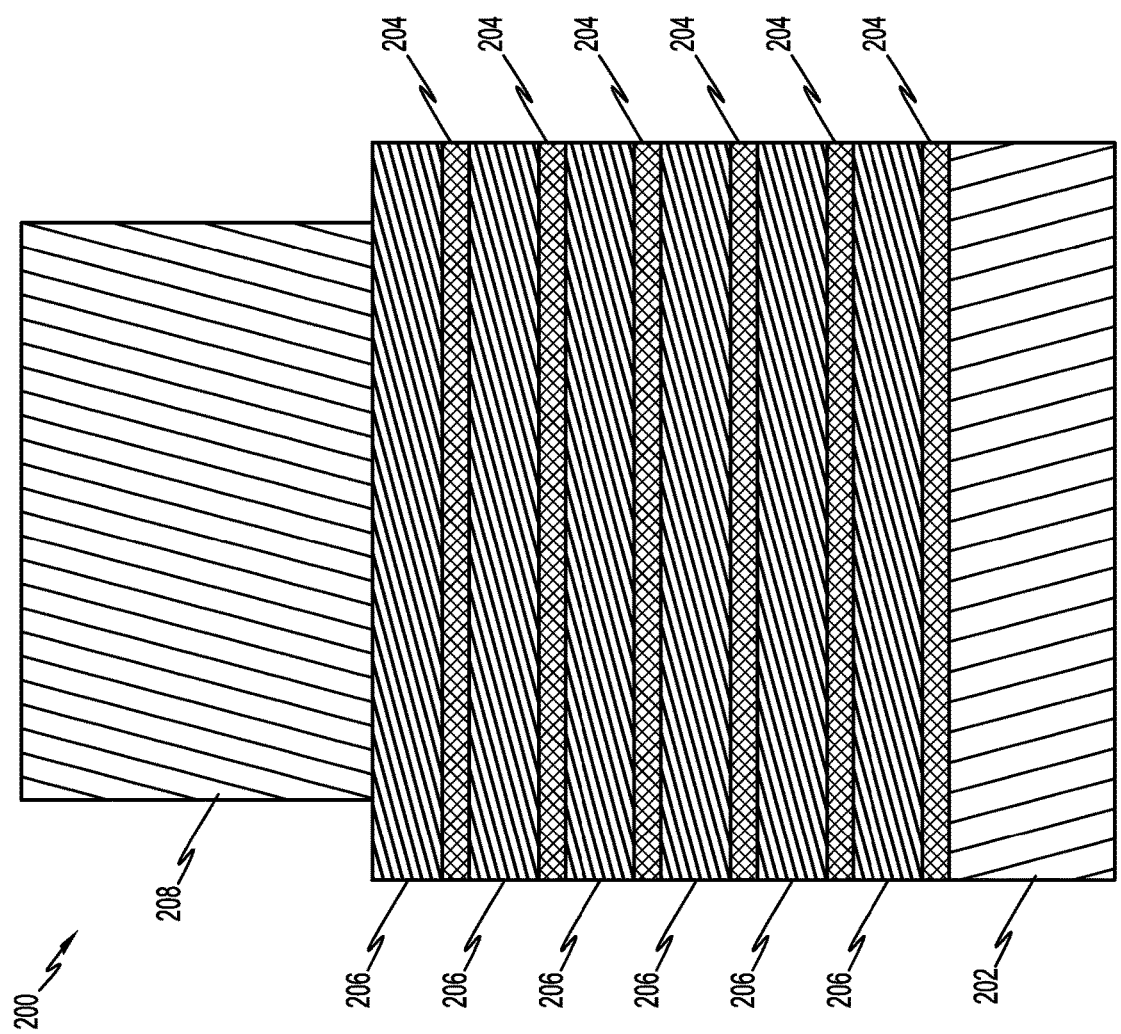
FIG. 11 is a cross-sectional view of a substrate taken along the A-A axis of FIG. 1A at a first-intermediate fabrication stage, according to an illustrative alternative embodiment.

FIGS. 11-19 illustrate an alternate embodiment starting with the structure 200. Note that the same reference numeral (200) is used to denote the structure through the various intermediate fabrication stages illustrated in FIGS. 11 through 19. First, FIG. 11 is a cross sectional view of a structure 200 taken along the A-A axis of FIG. 1A at a first-intermediate fabrication stage. Structure 200 is shown comprising substrate 202 together with insulating layers 204 and metal layers 206 in alternating order and hardmask 208. Substrate 202 can be of the same material as discussed above for substrate 102.

Insulating layers 204 are deposited by any of several known methods, such as ion implantation, thermal or plasma oxidation or nitridation, CVD, PVD, and ALD. Insulating layers 204 may be made from any of several known insulator materials. Suitable insulator materials include, for example, oxides, nitrides and oxynitrides of silicon. However, oxides, nitrides and oxynitrides of other elements are also contemplated. The insulating layers may be crystalline or non-crystalline. Insulating layers 204 may each have a thickness ranging from about 10 nm to about 50 nm, although lesser and greater thicknesses can also be employed.

Metal layers 206 are deposited by coating a plasmonic metal film on insulating layer 204, and may use techniques such as ALD. As shown in FIG. 11, metal layer is formed as the top layer in the alternating layers of insulating layer 204 and metal layer 206. In one embodiment, metal layer 206 is a plasmonic metal film. The metal layers 206 may be formed of the same material as discussed above for metal layer 106. The metal layers 206 may each have a thickness ranging from about 5 nm to about 50 nm, although lesser and greater thicknesses can also be employed.

In illustrative embodiments, the structure 200 may comprise between 6 and 30 layers the sum of all insulating layers 204 and metal layers 206), depending on the thickness of the individual layers and the desired height of the resulting staircase configuration. In one embodiment, the structure 200 may comprise between 10 and 200 total layers.

A hardmask 208 is then formed on the top metal layer 206 of alternating layers of insulating layer 204 and metal layer 206. As shown in FIG. 1A, the hardmask is deposited and patterned to form an array for forming a number of three-dimensional nano-structures protruding from the surface of substrate 200 as discussed herein below. Hardmask 208 can be deposited using deposition techniques including, but not limited to, CVD), PECVD, and PVD. Suitable material for hardmask 208 can be of the same material as discussed above for hardmask 104. In one embodiment, a suitable material for hardmask 208 includes, for example, amorphous carbon or amorphous silicon.

Figure 12:
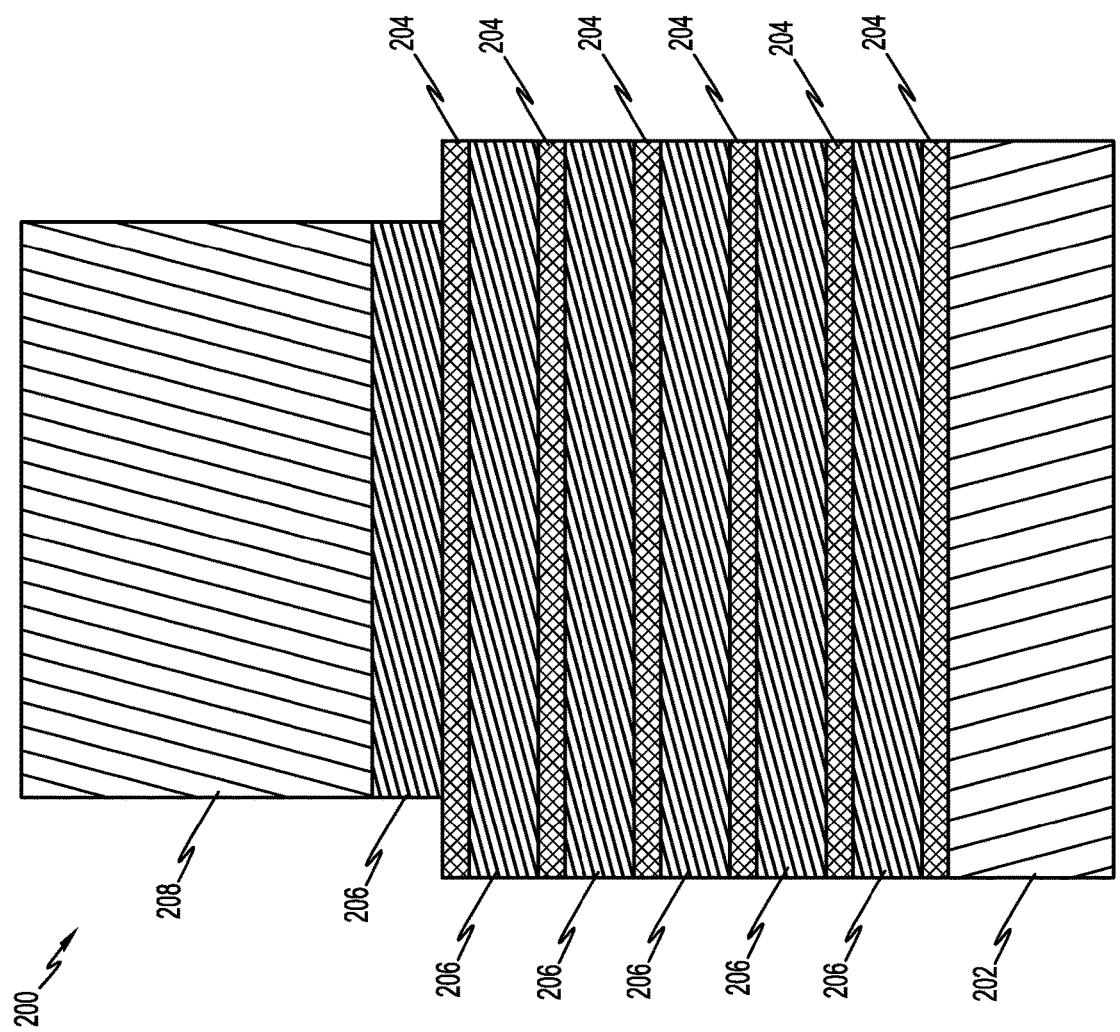
FIG. 12 is a cross-sectional view of the substrate taken along the A-A axis of FIG. 1A at a second-intermediate fabrication stage, according to an illustrative alternative embodiment.

FIG. 12 is a cross-sectional view illustrating the structure 200 taken along the A-A axis of FIG. 1A at a second intermediate stage of fabrication according to an exemplary embodiment. During this stage, a directional etching process such as, for example, a RIE process or ion beam etching, is carried out to etch the exposed top metal layer 206 of the alternating layers and selective to the hardmask 208 and insulator layer 204. In one embodiment, the directional etching process is a cyclic directional etching process.

Figure 13:
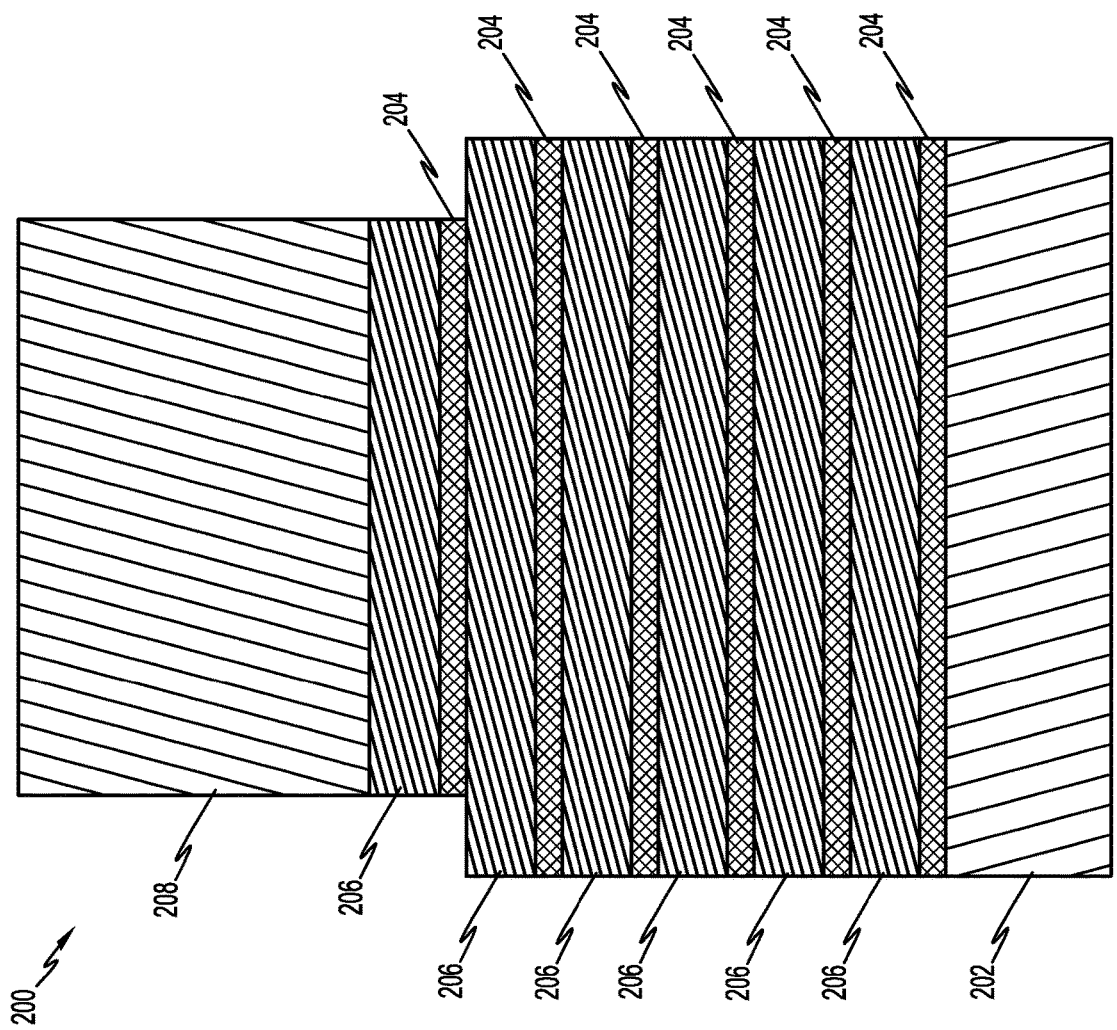
FIG. 13 is a cross-sectional view of the substrate taken along the A-A axis of FIG. 1A at a third-intermediate fabrication stage, according to an illustrative alternative embodiment.

FIG. 13 is a cross-sectional view illustrating the structure 200 taken along the A-A axis of FIG. 1A at a third intermediate stage of fabrication according to an exemplary embodiment. During this stage, a directional etching process such as, for example, a RIE process or ion beam etching, is carried out to etch the exposed top insulator layer 204 of the alternating layers of insulating layer 204 and metal layer 206 and selective to the hardmask 208 and metal layer 206. In one embodiment, the directional etching process is a cyclic directional etching process. The etching results in a staircase configuration in which top metal layer 206 and top insulator layer 204 form the first staircase portion of structure 200. The dimensions for the first staircase portion of structure 200 can be the same as discussed above for the first staircase portion of structure 100.

Figure 14:
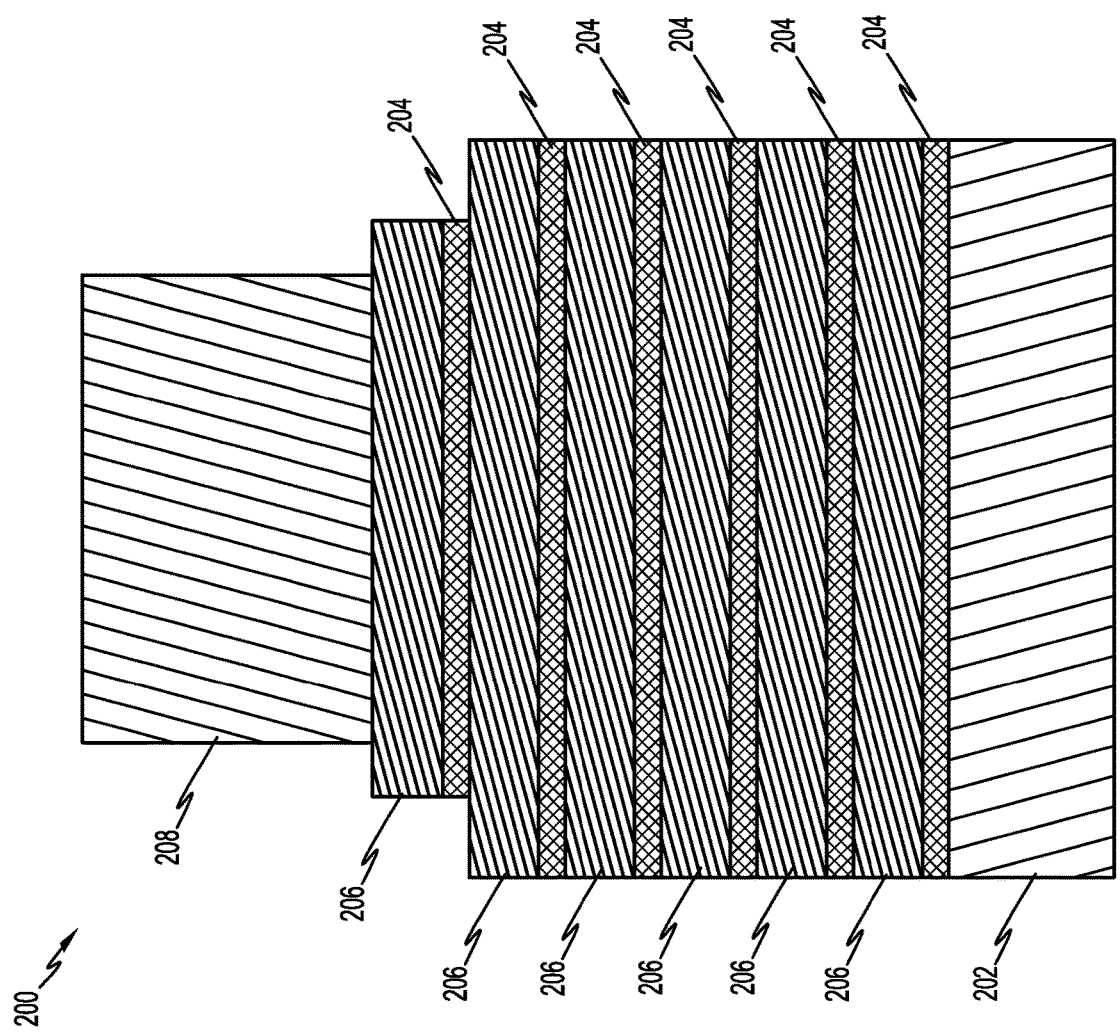
FIG. 14 is a cross-sectional view of the substrate taken along the A-A axis of FIG. 1A at a fourth-intermediate fabrication stage, according to an illustrative alternative embodiment.

FIG. 14 is a cross-sectional view illustrating the structure 200 taken along the A-A axis of FIG. 1A at a fourth intermediate stage of fabrication according to an exemplary embodiment. During this stage, hardmask 208 is trimmed by laterally etching hardmask 208 using a selective etching process such as, for example, an isotropic dry or wet etching process. In general, hardmask 208 is laterally etched to a desired width or diameter for performing additional directional etch processes to form the next step in the staircase configuration.

Figure 15:
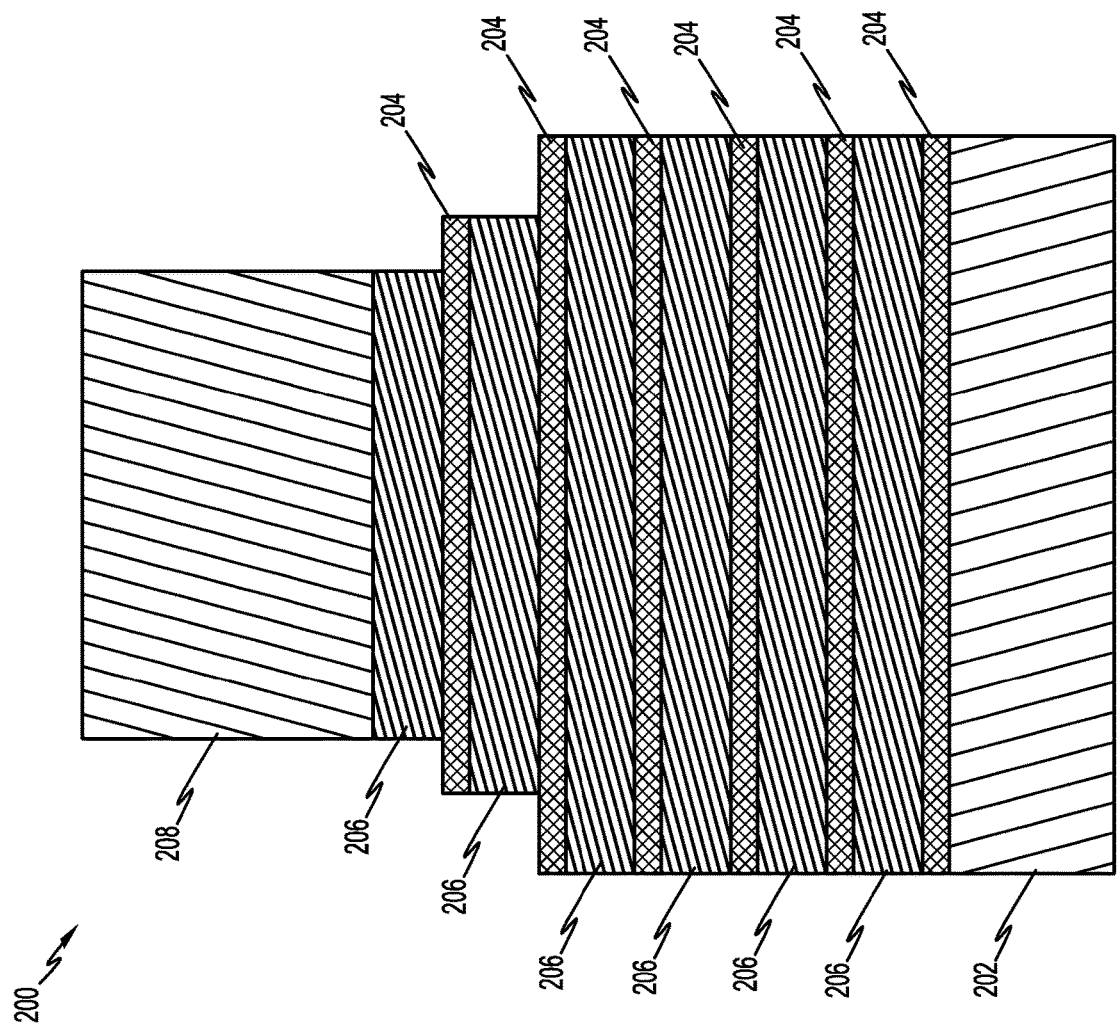
FIG. 15 is a cross-sectional view of the substrate taken along the A-A axis of FIG. 1A at a fifth-intermediate fabrication stage, according to an illustrative alternative embodiment.

FIG. 15 is a cross-sectional view illustrating the structure 200 taken along the A-A axis of FIG. 1A at a fifth intermediate stage of fabrication according to an exemplary embodiment. During this stage, another directional etching process such as, for example, RIE process, is carried out to etch the exposed metal layers 206 of the alternating layers. The directional etching process is selective to the hardmask 208 and insulator layers 204 in forming a second staircase portion in the staircase configuration. The dimensions for the second staircase portion of structure 200 can be the same as discussed above for the second staircase portion of structure 100.

Figure 16:
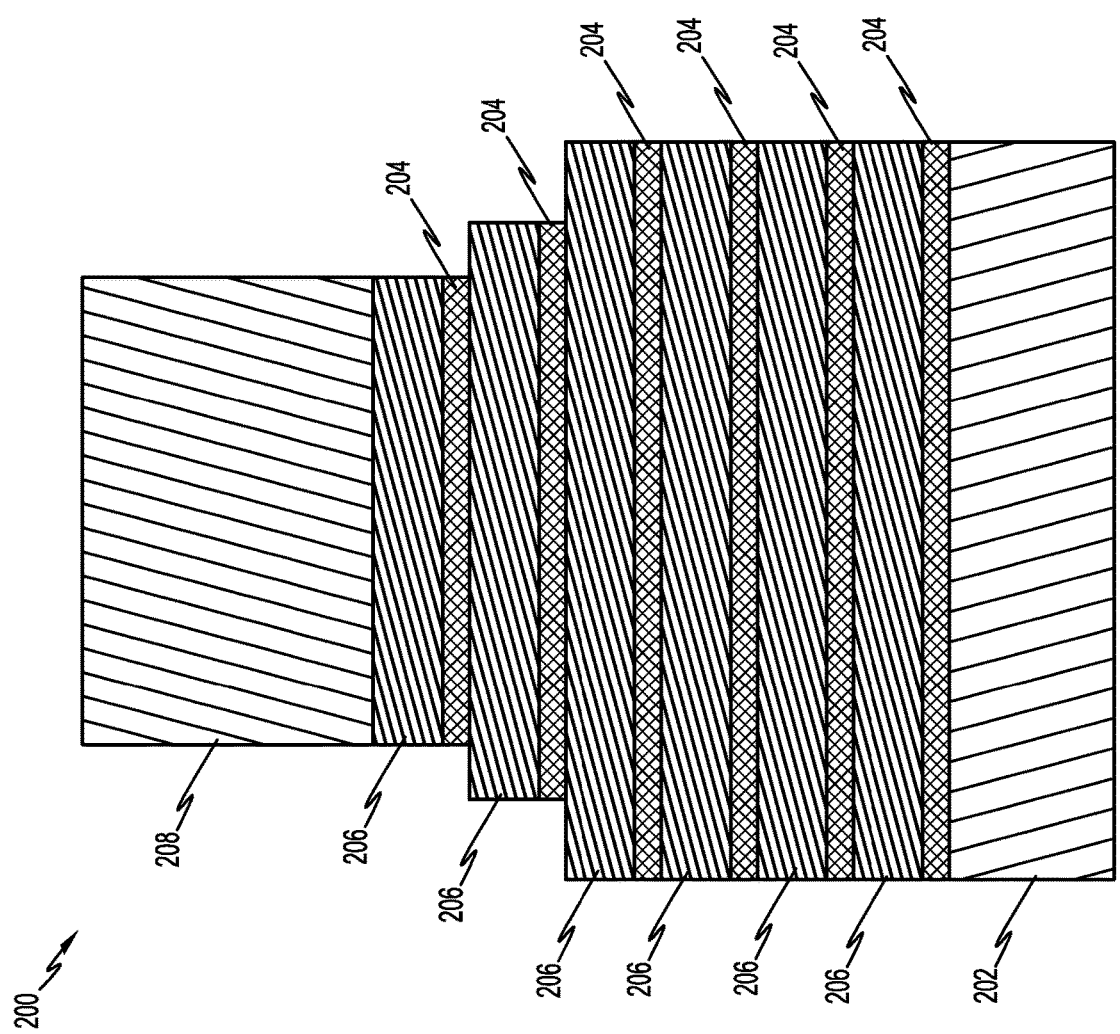
FIG. 16 is a cross-sectional view of the substrate taken along the A-A axis of FIG. 1A at a sixth-intermediate fabrication stage, according to an illustrative alternative embodiment.

FIG. 16 is cross-sectional view illustrating the structure 200 taken along the A-A axis of FIG. 1A at a sixth intermediate stage of fabrication according to an exemplary embodiment. During this stage, a directional etching process such as, for example, a RIE process or ion beam etching, is carried out to etch the exposed top insulator layers 204 of the alternating layers and selective to the hardmask 208 and metal layers 206. The etching results in a second staircase portion of the staircase configuration. In one embodiment, second staircase portion has a width or diameter that is greater than the width or diameter of the first staircase portion.

Figure 17:
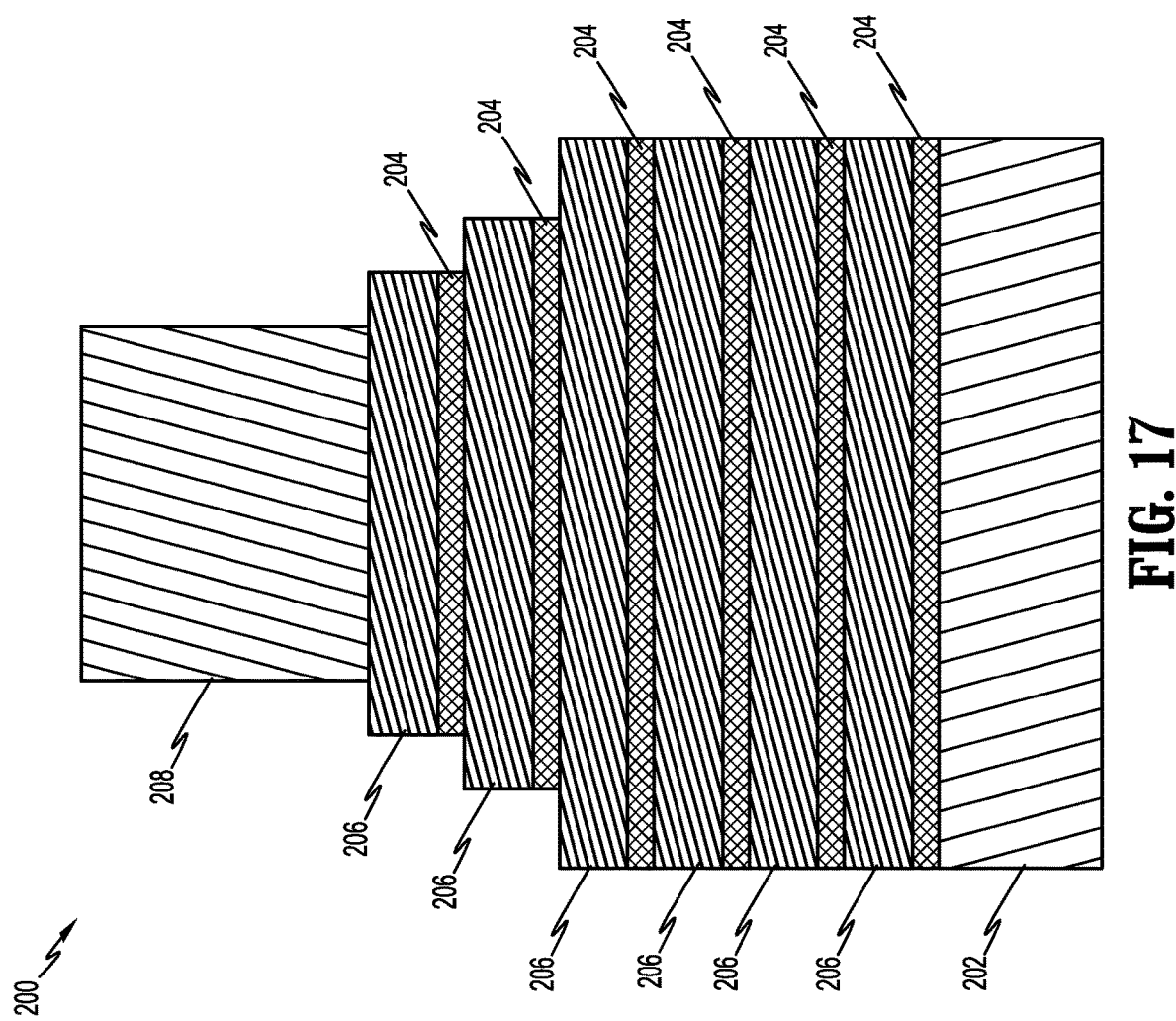
FIG. 17 is a cross-sectional view of the substrate taken along the A-A axis of FIG. 1A at a seventh-intermediate fabrication stage, according to an illustrative alternative embodiment.

FIG. 17 is cross-sectional view illustrating the structure 200 taken along the A-A axis of FIG. 1A at a seventh intermediate stage of fabrication according to an exemplary embodiment. During this stage, hardmask 208 is further trimmed by laterally etching hardmask 208 using a selective etching process as discussed above. In general, hardmask 208 is laterally etched to a desired width or diameter for performing additional directional etch processes to form the next step in the staircase configuration.

Figure 18:
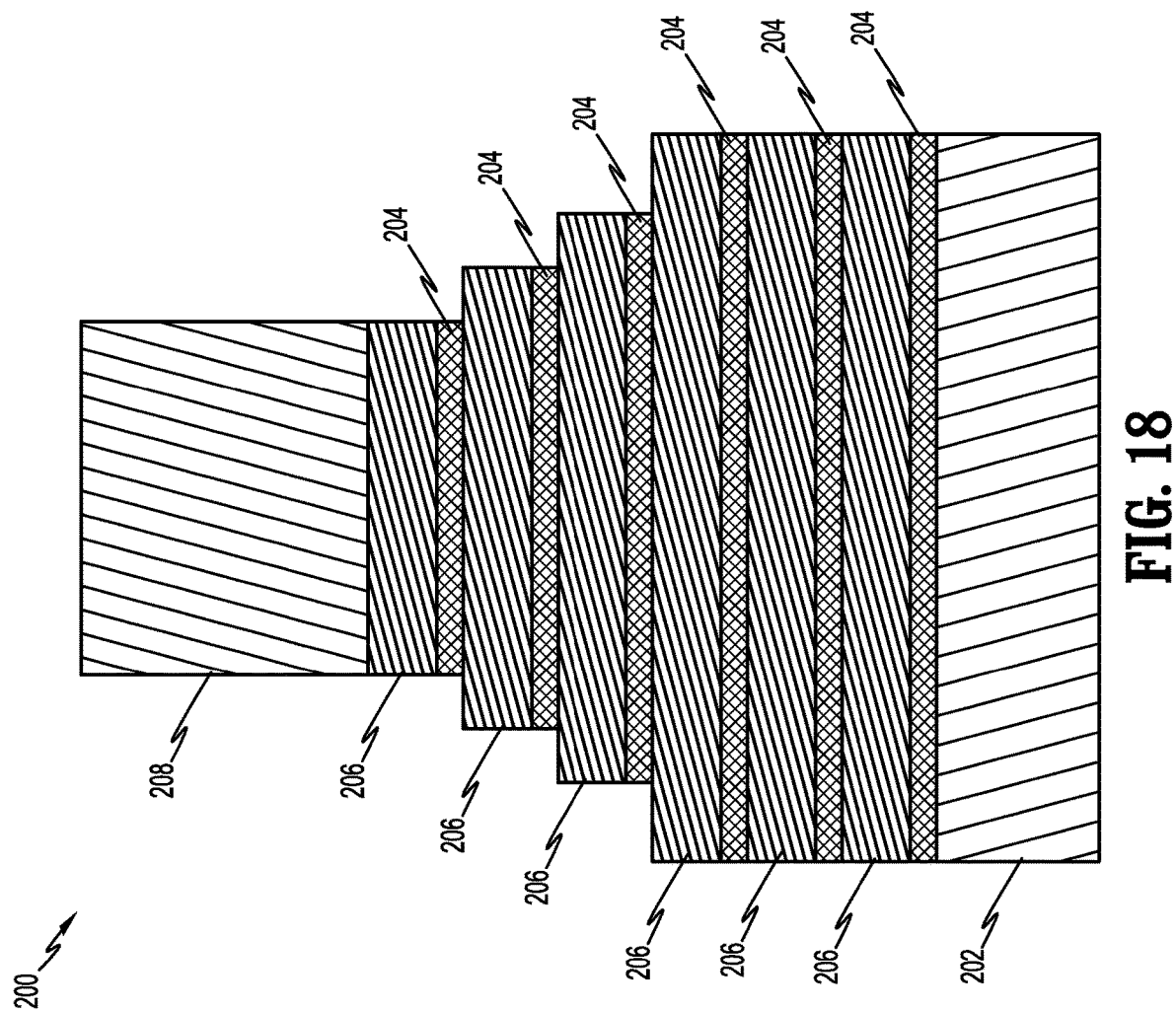
FIG. 18 is a cross-sectional view of the substrate taken along the A-A axis of FIG. 1A at an eighth-intermediate fabrication stage, according to an illustrative alternative embodiment.

FIG. 18 is a cross-sectional view illustrating the structure 200 taken along the A-A axis of FIG. 1A at an eighth intermediate stage of fabrication according to an exemplary embodiment. During this stage, a directional etching process as discussed above is carried out to first etch the exposed metal layers 206 of the alternating layers (not shown). Next, an additional directional etching process as discussed above is carried out to etch the exposed top insulator layers 204 of the alternating layers and selective to the hardmask 208 and metal layers 206. The etching results in a third staircase portion of the staircase configuration. In one embodiment, third staircase portion has a width or diameter that is greater than the width or diameter of the first staircase portion and the second staircase portion.

As one skilled in the art will understand, the process disclosed herein can be continued until the desired number of staircase portions are obtained as discussed above. Accordingly, one or more trimming and directional etching steps will be repeated to obtain the desired staircase configuration.

Figure 19:
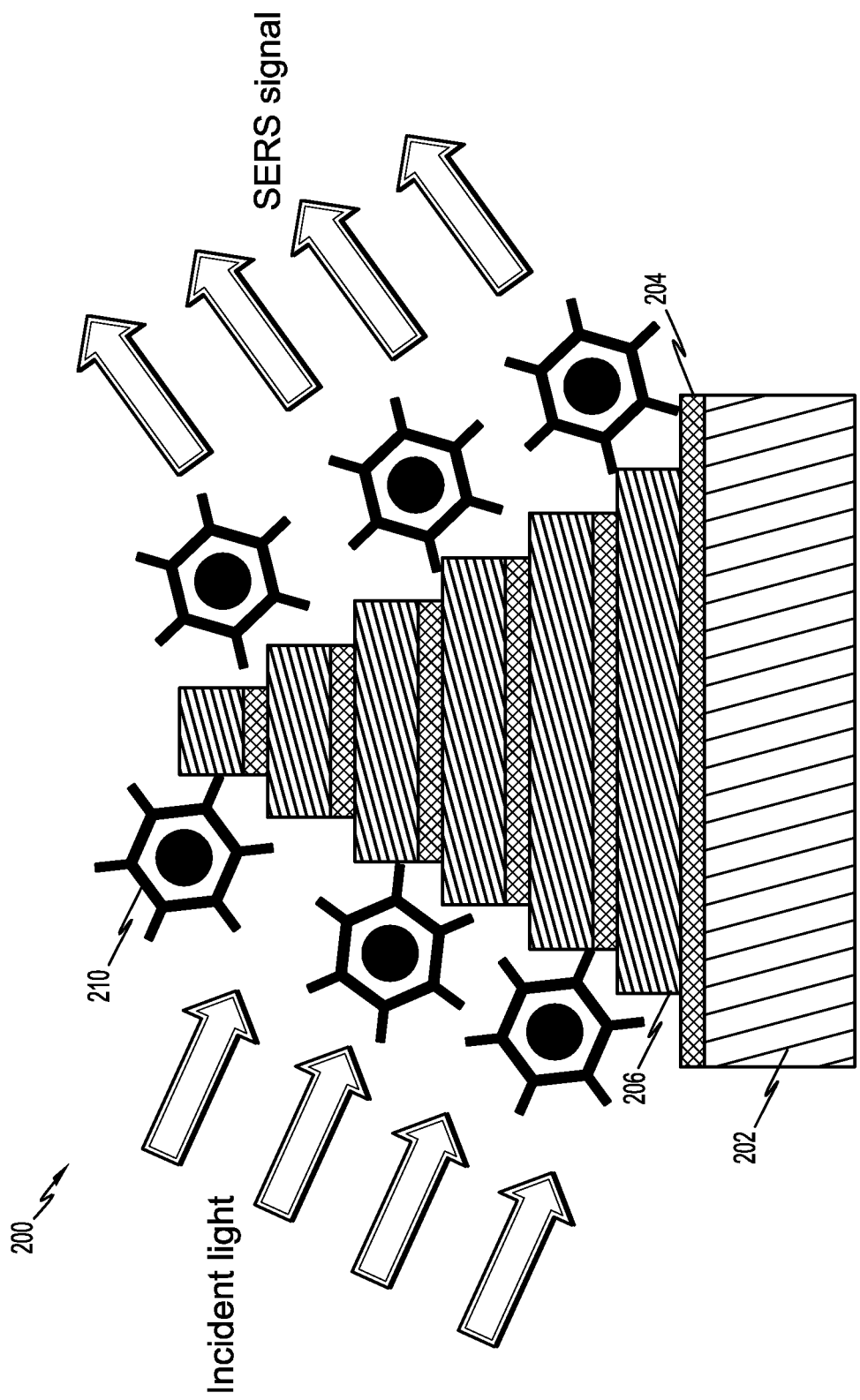
FIG. 19 is a cross-sectional view of the substrate taken along the A-A axis of FIG. 1A at a ninth-intermediate fabrication stage, according to an illustrative alternative embodiment.

FIG. 19 is cross-sectional view illustrating the structure 200 taken along the A-A axis of FIG. 1A at a ninth intermediate stage of fabrication according to an exemplary embodiment. During this stage, optionally, hardmask 208 is removed by conventional techniques. Next, molecules 210 are attached to the metal layers 206 as discussed above. Next, an application for SERS using the substrate is carried out for detecting molecules 210. As shown in FIG. 19, incident light is directed towards the surface of the structure 200, and a resulting SERS signal is reflected. The resulting SERS signal may be used to detect the type of molecules 210 present. In some embodiments, the structure 200 may be part of an integrated circuit chip or other device in which one or more CMOS devices are also formed for detecting the resulting SERS signal.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
   patterning a hardmask on a portion of a substrate;
   directionally etching a portion of an exposed portion of the substrate to form a first stepped portion;
   trimming the hardmask laterally to a first predetermined width after forming the first stepped portion; and
   directionally etching a portion of exposed horizontal portions of the substrate to form a second stepped portion after trimming the hardmask.

2. The method according to claim 1, further comprising:
   trimming the hardmask laterally to a second predetermined width; and
   directionally etching a portion of exposed horizontal portions of the substrate to form a third stepped portion.

3. The method according to claim 2, further comprising:
   removing the hardmask;
   forming a metal layer on the exposed portions of the substrate;
   disposing a molecule sample on a surface of the metal layer; and
   detecting the molecule sample with a detector.

4. The method according to claim 1, further comprising:
   removing the hardmask;
   forming a metal layer on the exposed portions of the substrate;
   disposing a molecule sample on a surface of the metal layer; and
   detecting the molecule sample with a detector.

5. The method according to claim 4, wherein forming the metal layer comprises depositing a plasmonic metal film selected from the group consisting of gold, silver, platinum, copper, and aluminum.

6. The method according to claim 1, wherein the directionally etching is a cyclic etching, and the substrate is a cylindrical pillar having a staircase configuration.

7. A method comprising:
   forming alternating layers of an insulating layer and a metal layer on a substrate, wherein the insulating layer is deposited on a top surface of the substrate and further wherein a top layer of the alternating layers is a top metal layer;
   patterning a hardmask on a portion of the alternating layers;
   directionally etching an exposed portion of the top metal layer exposing the alternating insulating layer;
   directionally etching the exposed portion of the alternating insulating layer to form a first stepped portion;
   trimming the hardmask laterally to a first predetermined width;
   directionally etching a portion of exposed horizontal portions of the alternating metal layers; and
   directionally etching exposed horizontal portions of the alternating insulating layer to form a second stepped portion.

8. The method according to claim 7, further comprising:
   trimming the hardmask laterally to a second predetermined width;
   directionally etching a portion of exposed horizontal portions of the alternating metal layers substrate; and
   directionally etching exposed horizontal portions of the alternating insulating layer to form a third stepped portion.

9. The method according to claim 7, further comprising:
   removing the hardmask;
   disposing a molecule sample on a surface of the metal layer; and
   detecting the molecule sample with a detector.

10. The method according to claim 9, wherein the detector is a Raman Spectroscopy.

11. The method according to claim 7, wherein the metal layer comprises a plasmonic metal film selected from the group consisting of gold, silver, platinum, copper, and aluminum.

12. The method according to claim 7, wherein the directionally etching is a cyclic etching, and the alternating layers are a cylindrical pillar having a staircase configuration.

13. A structure, comprising:
a substrate; and
an array of pillars disposed on the substrate;
wherein each pillar is of a staircase configuration; and
wherein each pillar comprises alternating layers of an insulating layer and a metal layer, the bottom layer of the alternating layers being an insulating layer disposed on a top surface of the substrate and a top layer of the alternating layers being a top metal layer.

14. The structure of claim 13, wherein the staircase configuration comprises a first step and one or more additional steps.

15. The structure of claim 13, wherein the array of pillars are an array of cylindrical pillar having the staircase configuration.

16. The structure of claim 13, further comprising one or more molecule samples disposed on a surface of the metal layer.

17. The structure of claim 13, wherein the array of pillars are an array of cylindrical pillar having the staircase configuration, the staircase configuration comprising a first step and one or more additional steps.

18. The structure of claim 13, further comprising one or more molecule samples disposed on a surface of the metal layer, the metal layer comprising a plasmonic metal film selected from the group consisting of gold, silver, platinum, copper, and aluminum.

19. The structure of claim 13, wherein each insulating layer of the alternating layers has a thickness ranging from about 10 nanometers (nm) to about 50 nm, and each metal layer of the alternating layers has a thickness ranging from about 5 nm to about 50 nm.

20. The structure of claim 13, which comprises between 10 and 200 total layers of the alternating layers.

* * * * *